(12) United States Patent
Hshieh

(10) Patent No.: US 7,633,121 B2
(45) Date of Patent: Dec. 15, 2009

(54) TRENCH MOSFET WITH IMPLANTED DRIFT REGION

(75) Inventor: Fwu-Iuan Hshieh, Saratoga, CA (US)

(73) Assignee: Force-MOS Technology Corp. (TW)

( * ) Notice: Subject to any disclaimer, the term of this patent is extended or adjusted under 35 U.S.C. 154(b) by 9 days.

(21) Appl. No.: 11/981,072

(22) Filed: Oct. 31, 2007

(65) Prior Publication Data

US 2009/0108338 A1 Apr. 30, 2009

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. .............. 257/330; 257/288; 257/401; 438/242; 438/268

(58) Field of Classification Search .......... 257/288, 257/330, 401; 438/242, 268, 274
See application file for complete search history.

(56) References Cited

U.S. PATENT DOCUMENTS

| | | | |
|---|---|---|---|
| 7,126,166 B2 * | 10/2006 | Nair et al. ............... | 257/110 |
| 7,345,342 B2 * | 3/2008 | Challa et al. ............. | 257/341 |
| 7,465,989 B2 * | 12/2008 | Hayashi .................. | 257/330 |
| 2004/0140517 A1 * | 7/2004 | Tsuchiko ................ | 257/493 |
| 2008/0073707 A1 * | 3/2008 | Darwish .................. | 257/330 |

* cited by examiner

Primary Examiner—Phuc T Dang
(74) Attorney, Agent, or Firm—Bo-In Lin

(57) ABSTRACT

A method to manufacture a trenched semiconductor power device including a plurality of trenched gates surrounded by source regions near a top surface of a semiconductor substrate encompassed in body regions. The method for manufacturing the trenched semiconductor power device includes a step of carrying out a tilt-angle implantation through sidewalls of trenches to form drift regions surrounding the trenches at a lower portion of the body regions with higher doping concentration than the epi layer for Rds reduction, and preventing a degraded breakdown voltage due to a thick oxide in lower portion of trench sidewall and bottom. In an exemplary embodiment, the step of carrying out the tilt-angle implantation through the sidewalls of the trenches further includes a step of carrying out a tilt angle implantation with a tilt-angle ranging between 4 to 30 degrees.

13 Claims, 16 Drawing Sheets

TRENCH MOSFET WITH IMPLANTED DRIFT REGION

BACKGROUND OF THE INVENTION

1. Field of the Invention

The invention relates generally to the device configuration and manufacturing methods for fabricating the semiconductor power devices. More particularly, this invention relates to an improved and novel manufacturing process and device configuration for providing the MOSFET device with implanted drifted region to prevent degraded breakdown voltages for both the active area and the termination area.

2. Description of the Related Art

In order to increase the switching speed of a semiconductor power device, it is desirable to reduce the electric charges between the gate and drain such that a reduction of a gate to drain capacitance Crss can be reduced. A thick oxide formed at the trench bottom of the trench gate is frequently implemented to reduce the gate to drain capacitance. However, a thicker oxide layer formed at the trench bottom may also cause further technical difficulties and limitations of device implementations. Since the epitaxial layer has a resistivity that is significantly dropped in order to satisfy a design target of further reducing the Rds, the device designers now confront another technical difficulty. With the reduction of the epitaxial resistivity, the edge trench filed plate may not support the requirement that the breakdown voltage in the termination area must be higher than edge trench field plate. A degradation of the breakdown voltage is therefore becoming a design and operation limitation.

Several patented inventions are implemented with thicker oxide layer in the bottom of the trenched gate in order to reduce the charges between the gate and the drain. FIG. 1A shows a trenched MOSFET device disclosed by Blanchard in U.S. Pat. No. 4,914,058. The trenched MOSFET device has a thicker gate oxide on the bottom and on the lower portion of the trench sidewalls. FIG. 1B shows a cross sectional view of another MOSFET device disclosed by U.S. Pat. Nos. 6,808,533, 6,833,584, and 6,720,616. The last trench on the right hand side is implemented as a field plate. However, as discussed above, when the resistivity of the epitaxial layer is decreased to provide a low Rds, the trench field plate may not support the breakdown voltage.

FIG. 1C is another cross sectional view of an alternate MOSFET device disclosed by U.S. Pat. No. 7,091,573 and Patent Publication 20070187753. A reduced Rds is achieved by reducing the epitaxial layer resistivity without degrading the breakdown voltage by applying a RESURF (Reduced Surface Electric Field) step oxide structure that has a reduced surface electric field with a thick oxide layer on the trench sidewall and the bottom surface of the trench. Additional disclosures of similar technologies are also published by M. A. Gajda et al "Industrialisation of Resurf Stepped Oxide Technology for power Transistors" (Proceedings of the 18$^{th}$ International Symposium on Power Semiconductor Device and ICs Jun. 4-8 2006 ISPD 2006) However, the trenched filed plate termination may not support the targeted breakdown voltage due to the lower epitaxial resistivity than the conventional devices.

Therefore, a need still exists in the art of power semiconductor device design and manufacture to provide new manufacturing method and device configuration in forming the semiconductor power devices such that the above discussed problems and limitations can be resolved.

SUMMARY OF THE PRESENT INVENTION

It is therefore an aspect of the present invention to provide a new and improved semiconductor power device by forming a thick oxide layer at the bottom portions of a gate with angular implanted drift regions surrounding trench sidewalls. The power semiconductor such as a MOSFET device can be implemented with standard termination and epitaxial resistivity while achieving breakdown voltages for both the active area and the termination area such that the above discussed difficulties and limitations of the convention power semiconductor devices can be resolved.

Another aspect of this invention is to form an improved MOSFET device with thick either split gate or gate padded with thicker oxide layer at the bottom of the trenched gate such that the gate to drain capacitance can be reduced. The performance of the device is further improved with reduced Rds by reducing the resistivity of the epitaxial layer while implemented with tilt-angle implanted drift regions to prevent degraded breakdown voltage both in the active cell areas or in the termination area.

Another aspect of this invention is to form an improved MOSFET device with tilt-angle implanted drift regions for preventing degraded breakdown voltages with reduced epitaxial resistivity. A breakdown voltage of less than fifty volts can be implemented with regular field plate without requiring guard rings. A breakdown voltage of greater than fifty volts can be implemented with guard rings formed in the termination area. Additional performance is achieved with either a split gate or a gate with thicker bottom oxide layer and thinner upper gate layer.

Briefly in a preferred embodiment, this invention discloses a trenched semiconductor power device comprising a plurality of trenched gates surrounded by source regions near a top surface of a semiconductor substrate encompassed in body regions. The trenched semiconductor power device further includes tilt-angle implanted drift regions surrounding the trenched gate at a lower portion of the body regions for preventing a degraded breakdown voltage due to a reduced epitaxial resistivity of an epitaxial layer supported on the semiconductor substrate. In an exemplary embodiment, the semiconductor power device further includes a metal oxide semiconductor field effect transistor (MOSFET) device. In an exemplary embodiment, the semiconductor power device further includes a N-channel MOSFET device having N-type tilt-angle implanted drift regions in an N-epitaxial layer supported on a N+ substrate. In an exemplary embodiment, the semiconductor power device further includes a P-channel MOSFET device having P tilt-angle implanted drift regions in a P-epitaxial layer supported on a P+ type substrate. In another exemplary embodiment, the semiconductor power device further includes guard rings disposed at a termination area for operating at a breakdown voltage greater than fifty volts and in a range of approximately 50 to 200 volts. In another exemplary embodiment, the semiconductor power device further includes a field plate disposed at a termination area for operating at a breakdown voltage ranging between eight volts to fifty volts. In another exemplary embodiment, each of the trenched gates having a thicker oxide layer on sidewalls of a lower portion of the trenched gates and a thinner oxide layer on sidewalls at an upper portion of the trenched gates. In another exemplary embodiment, each of the trenched gates further includes a bottom portion having a smaller width and padded with a thicker gate oxide layer on sidewalls of the trenched gates and a top portion having a greater width and padded with a thinner gate oxide layer on sidewalls of the trenched gates. In another exemplary embodiment, the epitaxial layer having a resistivity ranging between 0.3 to 3.0 mohm-cm and the trenched semiconductor power device having a breakdown voltage ranging between 8 to 200 volts. In the active area, since the thick oxide thickness in the trench bottom and in the lower portion of the sidewalls ranging from 0.1 to 1.0 um, with the thickness of the oxide layer depending on the breakdown voltage, shares more than 50% voltage during reverse bias, the doping concentration of the implanted drift region is thus significantly enhanced without degrading the targeted breakdown voltage. In termination region, the lightly doped epi is able to support the target breakdown voltage using traditional terminations such as metal filed-plate, and combination of field plate with guard ring.

Furthermore, this invention discloses a method to manufacture a trenched semiconductor power device including a plurality of trenched gates surrounded by source regions near a top surface of a semiconductor substrate encompassed in body regions. The method for manufacturing the trenched semiconductor power device includes a step of carrying out a tilt-angle implantation through sidewalls of trenches to form drift regions surrounding the trenches at a lower portion of the body regions with a higher doping concentration than the epi layer for Rds reduction, and preventing a degraded breakdown voltage due to a thick oxide in lower portion of trench sidewall and bottom. In an exemplary embodiment, the step of carrying out the tilt-angle implantation through the sidewalls of the trenches further includes a step of carrying out a tilt angle implantation with a tilt-angle ranging between 4 to 30 degrees. In another exemplary embodiment, the step of carrying out the tilt-angle implantation through the sidewalls of the trenches further includes a step of carrying out a tilt angle implantation of a N dopant for manufacturing an N-channel MOSFET device having N-type tilt-angle implanted drift regions in an N− epitaxial layer supported on a N+ substrate. In another exemplary embodiment, the step of carrying out the tilt-angle implantation through the sidewalls of the trenches further includes a step of carrying out a tilt angle implantation of a P dopant for manufacturing an P-channel MOSFET device having P-type tilt-angle implanted drift regions in an P-epitaxial layer supported on a P+ substrate. In another exemplary embodiment, the method further includes a step of forming guard rings at a termination area for manufacturing the semiconductor power device have a breakdown voltage greater than fifty volts in a range approximately between fifty to two-hundreds volts. In another exemplary embodiment, the method further includes a step of forming a field plate at a termination area for operating at a breakdown voltage ranging between eight volts to fifty volts. In another exemplary embodiment, the method further includes a step of forming a thicker oxide layer on sidewalls of a lower portion of the trenches and a thinner oxide layer on sidewalls at an upper portion of the trenches. In another exemplary embodiment, the method further includes a step of forming a bottom portion of the trenched gates having a smaller width and padded with a thicker gate oxide layer on sidewalls of the trenched gates and forming a top portion of the trenched gates having a greater width and padded with a thinner gate oxide layer on sidewalls of the trenched gates. In another exemplary embodiment, the method further includes a step of forming the epitaxial layer having a resistivity ranging between 0.3 to 3.0 ohm-cm and manufacturing the trenched semiconductor power device having a breakdown voltage ranging between 8 to 200V volts. In the active area, since the thick oxide thickness in the trench bottom and in the lower portion of the sidewalls ranging from 0.1 to 1.0 um, with the thickness of the oxide layer depending on the breakdown voltage, shares more than 50% voltage during reverse bias, the doping concentration of the implanted drift region is thus significantly enhanced without degrading the targeted breakdown voltage. In termination region, the lightly doped epi is able to support the target breakdown voltage using traditional terminations such as metal filed-plate, and combination of field plate with guard ring.

In another exemplary embodiment, the method further includes a step of forming each of the trenched gates as a split gate includes a bottom gate segment and a top gate segment insulated by an inter-segment insulation layer. In another exemplary embodiment, the method further includes a step of padding each of the bottom gate segments by a thicker oxide layer on sidewalls of a lower portion of the trenched gates and padding each of the top gate segments by a thinner oxide layer on sidewalls at an upper portion of the trenched gates.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
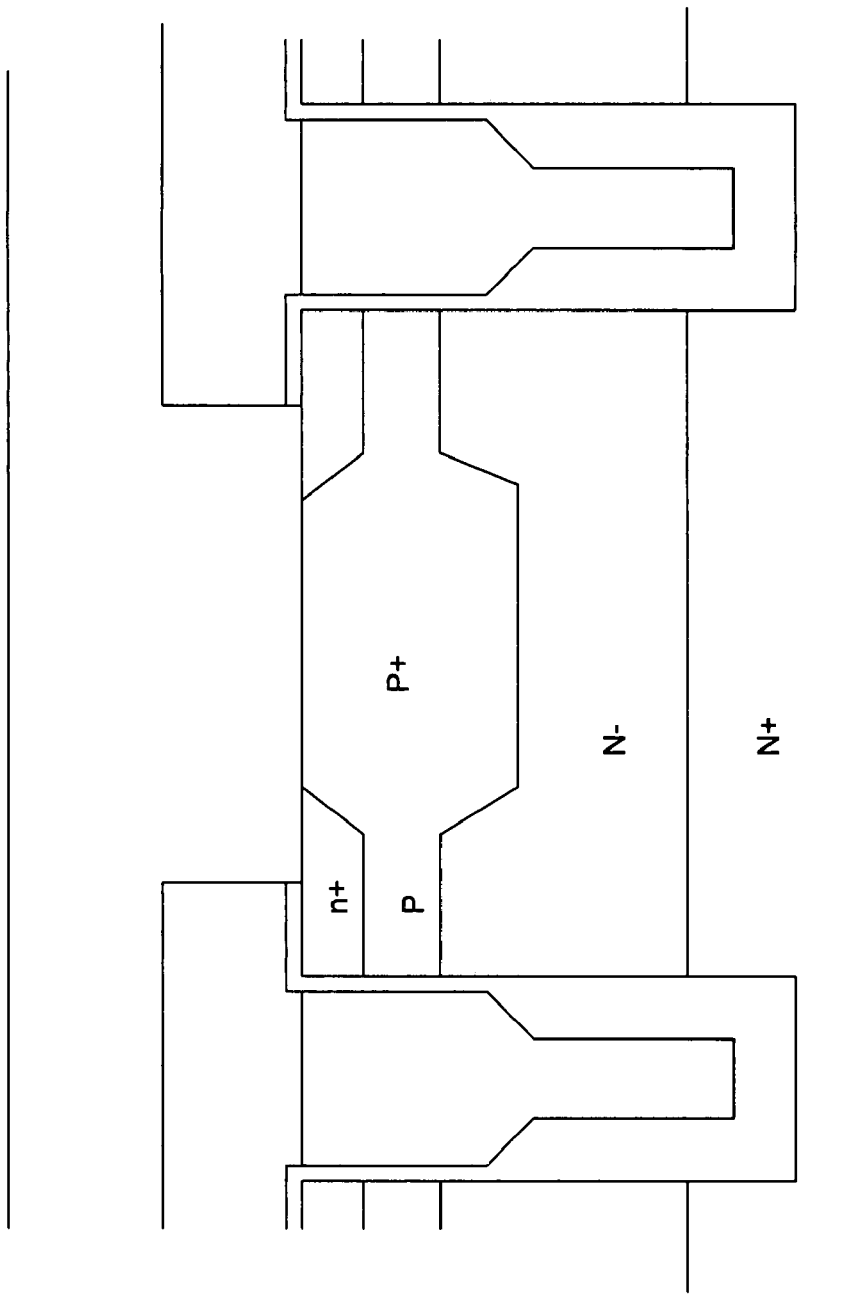
FIGS. 1A to 1C are cross sectional views of different conventional trenched MOSFET power devices with reduced gate-to-drain capacitance and reduced epitaxial resistivity.
Figure 1B:
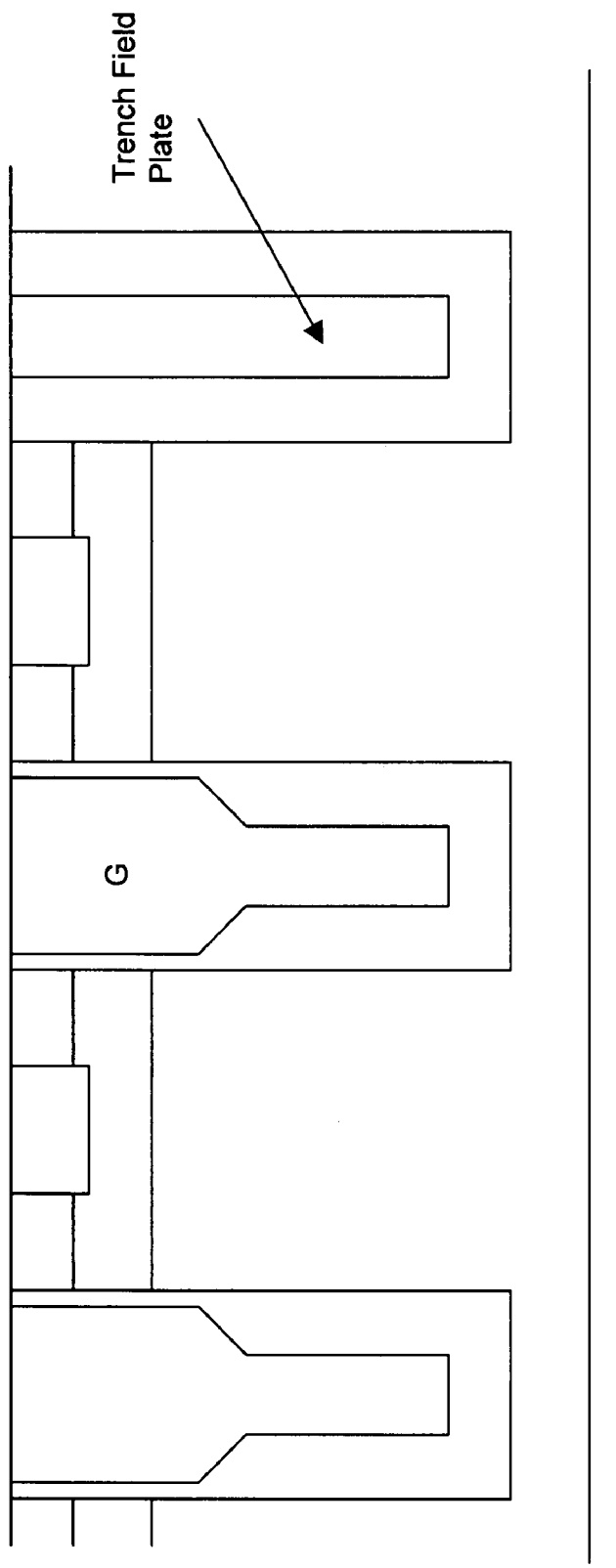
Figure 1C:
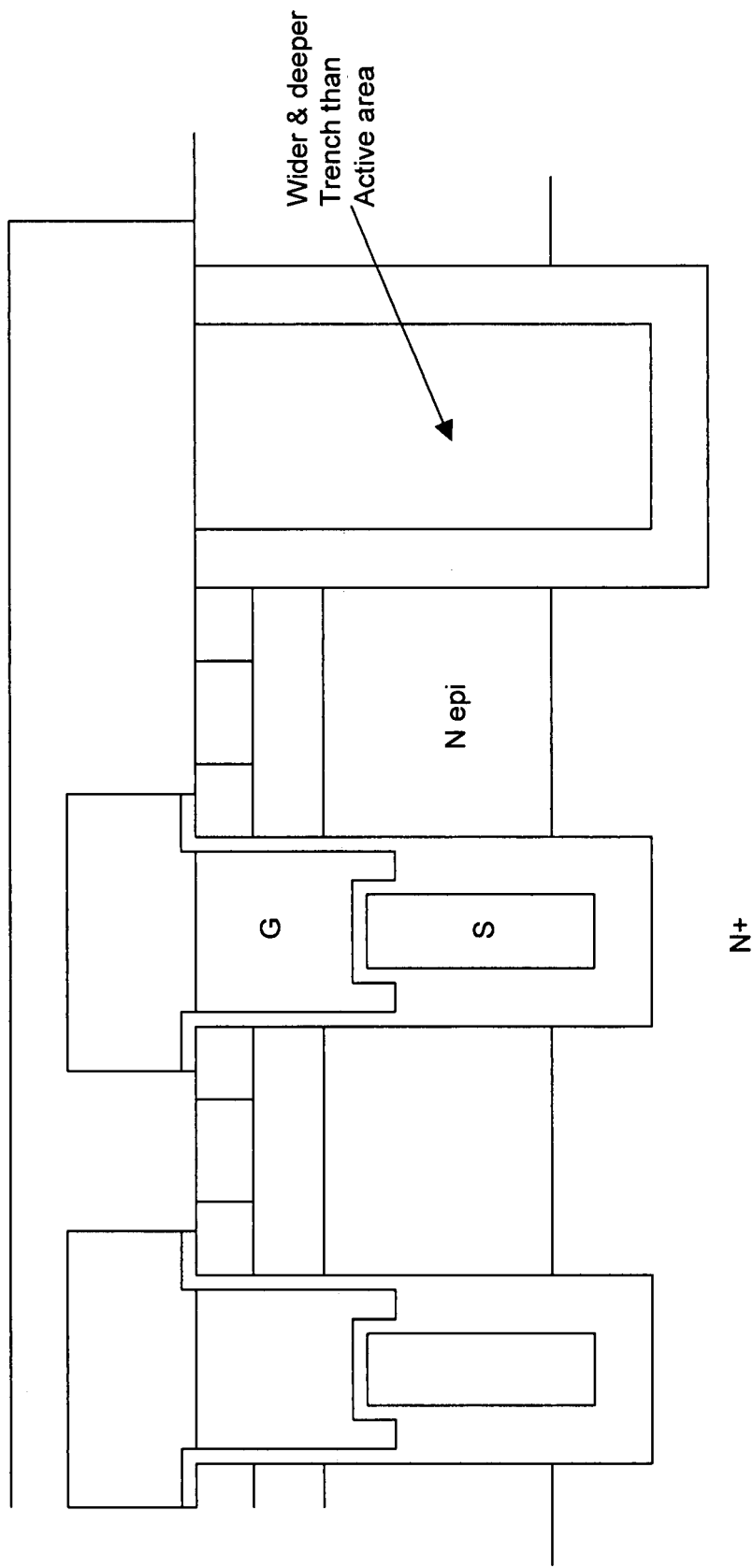
Figure 2:
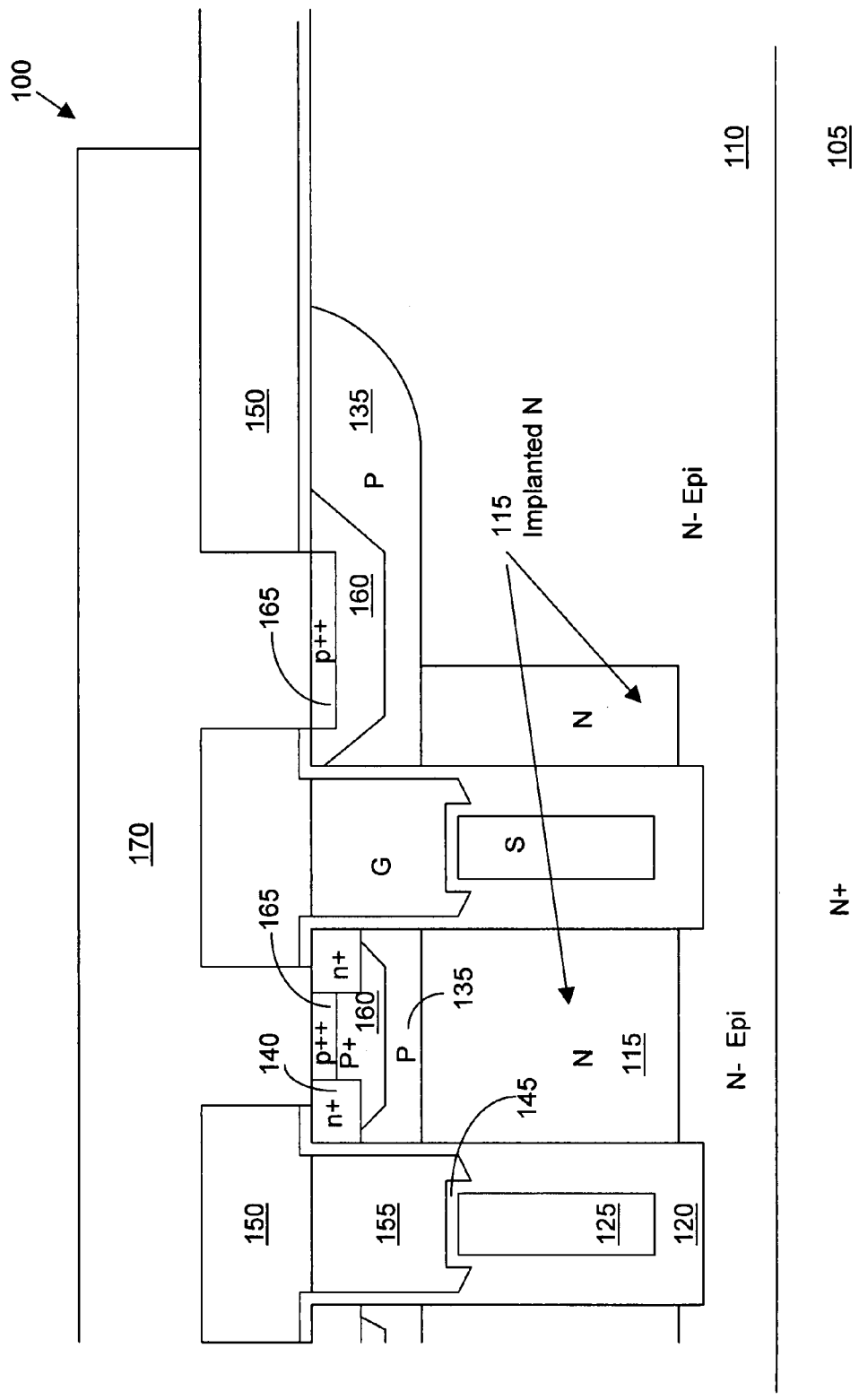
FIGS. 2 to 5 are four alternate embodiments of the present invention of a MOSFET device implemented with a tilt-angle implanted drift region surrounding a lower portion of the trenched gate for preventing a degraded breakdown voltage with reduced epitaxial resistivity.

Referring to FIG. 2 for a side cross sectional view of a MOSFET device 100 formed on a N+ substrate 105 supporting an N-epitaxial layer 110 with trenched polysilicon gates. Each of these trenched gates includes a top gate segment 155 and a bottom gate segment 125 insulated by an inter-gate-segment oxide layer 145. The bottom gate segment 125 is padded by a thick oxide layer 120 and the top gate segment is padded by a normal gate oxide layer 145' that is formed by the same oxide layer growth process as the inter-gate-segment insulation oxide 145. A plurality of P-body regions 135 surround the trenched gates that include the top and bottom gate segments 125 and 155 respectively. The body regions 135 further encompassed source regions 140 formed near the top surface of the epitaxial layer 110 surrounding the trenched gates. The areas on the top surface between adjacent source regions 140 are implemented as source contact surface. For the purpose of enhancing device ruggedness or avalanche capability to avoid parasitic N+PN+ bipolar turning on, a deeper P+ dopant region 160 is formed in the P-body region 135 below the source regions 145 and a P++ dopant region 165 is formed between the source region 140 near the top surface for ohmic contact to front metal. An oxide insulation layer 150 covering the top surface with contact openings right above the contact enhancing dopant regions 165 are opened through the insulation layer to allow for the metal contact layer 170 to physically contact the source/body regions through the contact enhancing regions 165. The contact metal layer is further patterned to provide a gate pad (not specifically shown) to contact the gate. The deeper regions are formed for the purpose of enhancing device ruggedness or avalanche capability to avoid inadvertently turning on the parasitic N+PN+ bipolar transistor.

The MOSFET device has special N-implanted drift regions 115 below the body regions 135 above the epitaxial layer 110 between the trenched gates 125. The drift regions 115 formed next to the bottom gate segment of the split trenched-gate 125 as shown in this exemplary embodiment is provided without requiring the guard rings. The drift regions 115 are formed with a tilt angle implantation process as will be further explained below. With regular field plate implemented in this exemplary embodiment, the device is provide to operate with a breakdown voltage less than fifty volts (50V). By providing the tilt-angle implanted drift region next to the gate segments 125, the degradation of the breakdown voltage is prevented. A degraded breakdown in the active cell areas and in the termination is overcome by implementing the tilt-angle implanted drift regions 115 and a reduced gate-to-drain capacitance is achieved with a split gate.

Figure 3:
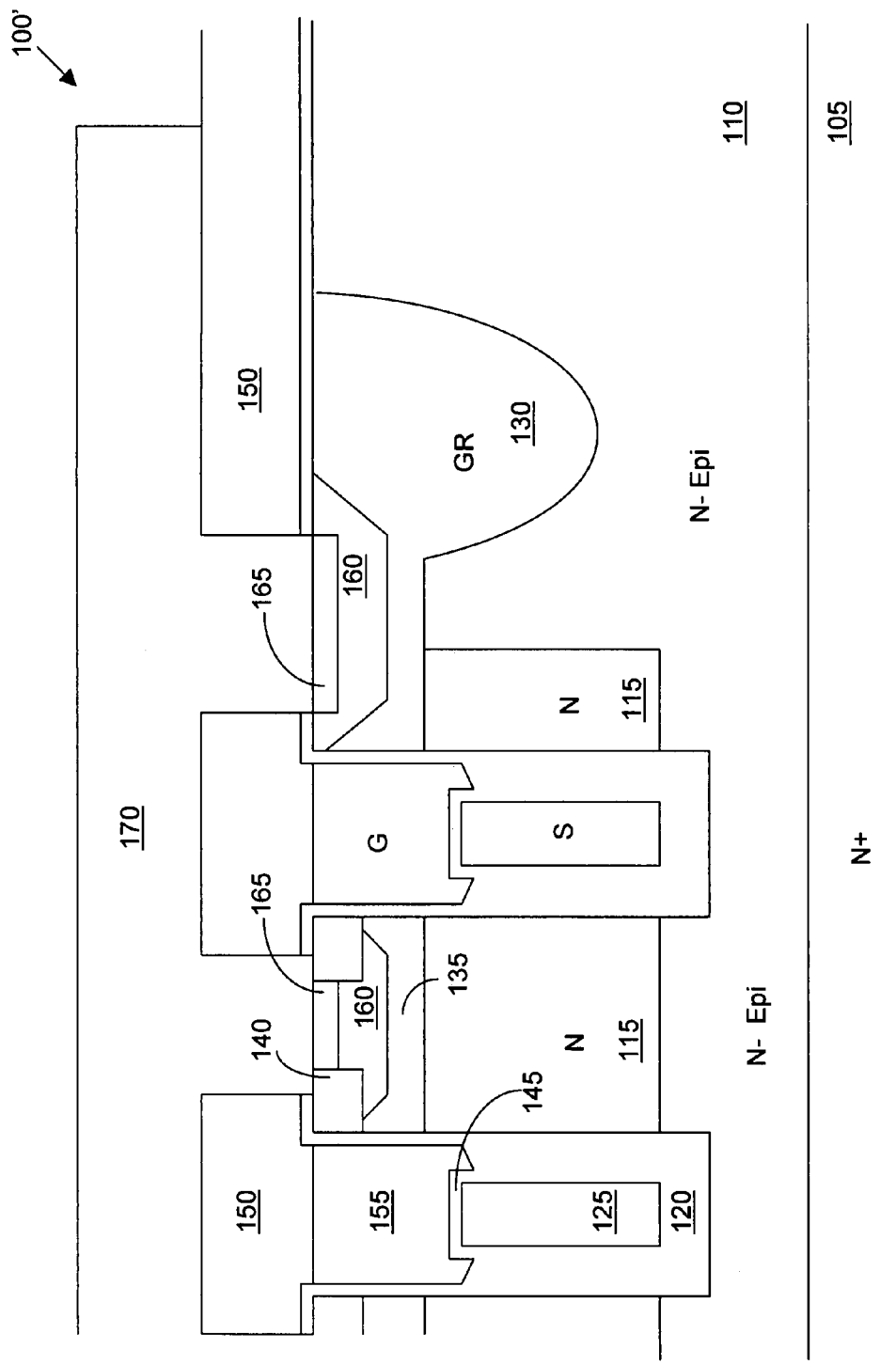

FIG. 3 shows a side cross sectional view of an alternate MOSFET device 100' with similar device configuration as the MOSFET 100 of FIG. 2. The only difference is that the MOSFET 100' further includes a guard ring 130 in the termination area. The device satisfies a requirement that the breakdown voltage of the device is greater than fifty volts (50V).

Again, the MOSFET device 100' has special N-implanted drift regions 115 below the body regions 135 above the epitaxial layer 110 between the trenched gates 125. The drift regions 115 formed next to the bottom gate segment of the split trenched-gate 125 as shown in this exemplary embodiment is provided without requiring the guard rings. The drift regions 115 are formed with a tilt angle implantation process as will be further explained below. With guard rings 130 implemented in this exemplary embodiment, the device is provide to operate with a breakdown voltage greater than fifty volts (50V). By providing the tilt-angle implanted drift region next to the gate segments 125, the degradation of the breakdown voltage is prevented. A degraded breakdown in the active cell areas and in the termination is overcome by implementing the tilt-angle implanted drift regions 115 and a reduced gate-to-drain capacitance is achieved with a split gate.

Figure 4:
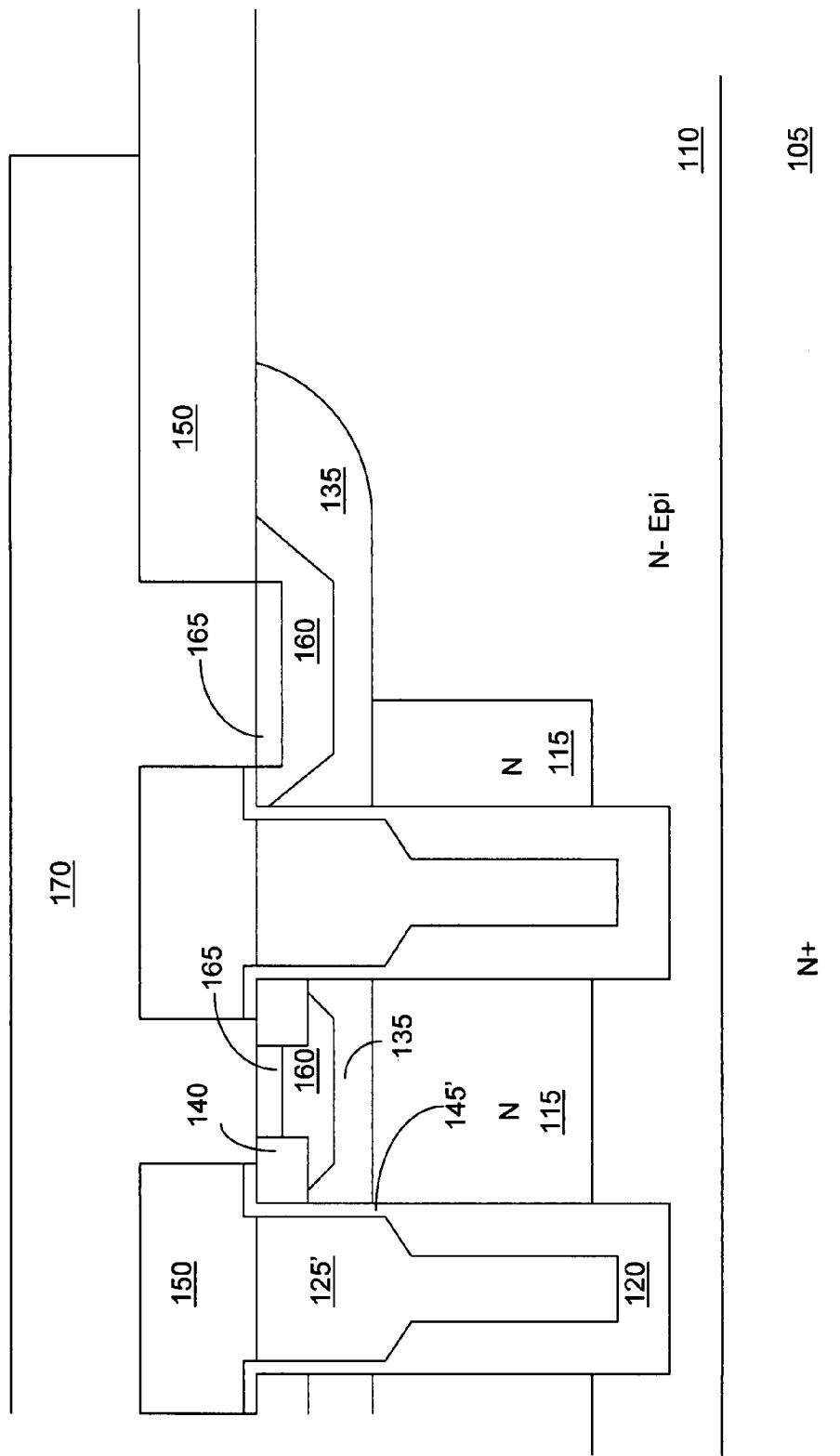

FIG. 4 shows a side cross sectional view of another alternate MOSFET device 100" with similar device configuration as the MOSFET 100 of FIG. 2. The only difference is that the MOSFET 100" is implemented with a gate 125'. Instead of the split gates included in the MOSFET 100 of FIG. 2, the gate 125' in the exemplary embodiment is a single segment gate. The gate 125' has a greater with at a top portion and a narrower width at a bottom portion. The bottom portion of the gate 125' is padded with a thick oxide layer 10 and the top portion of the gate 125' is padded with a thinner gate oxide 145'. The device satisfies a requirement that the breakdown voltage of the device is less than fifty volts (50V) with requiring the guard rings in the termination area.

Similar to the MOSFET 100 and 100', the MOSFET device 100" has special N-implanted drift regions 115 below the body regions 135 above the epitaxial layer 110 between the lower portion of the trenched gates 125'. The drift regions 115 formed next to the lower portion of the trenched-gate 125' as shown in this exemplary embodiment is provided without requiring the guard rings. The drift regions 115 are formed with a tilt angle implantation process as will be further explained below. Without requiring the guard rings in this exemplary embodiment, the device is provide to operate with a breakdown voltage less than fifty volts (50V). By providing the tilt-angle implanted drift region next to the gate segments 125', the degradation of the breakdown voltage is prevented. A degraded breakdown in the active cell areas and in the termination is overcome by implementing the tilt-angle implanted drift regions 115 and a reduced gate-to-drain capacitance is achieved with a split gate.

Figure 5:
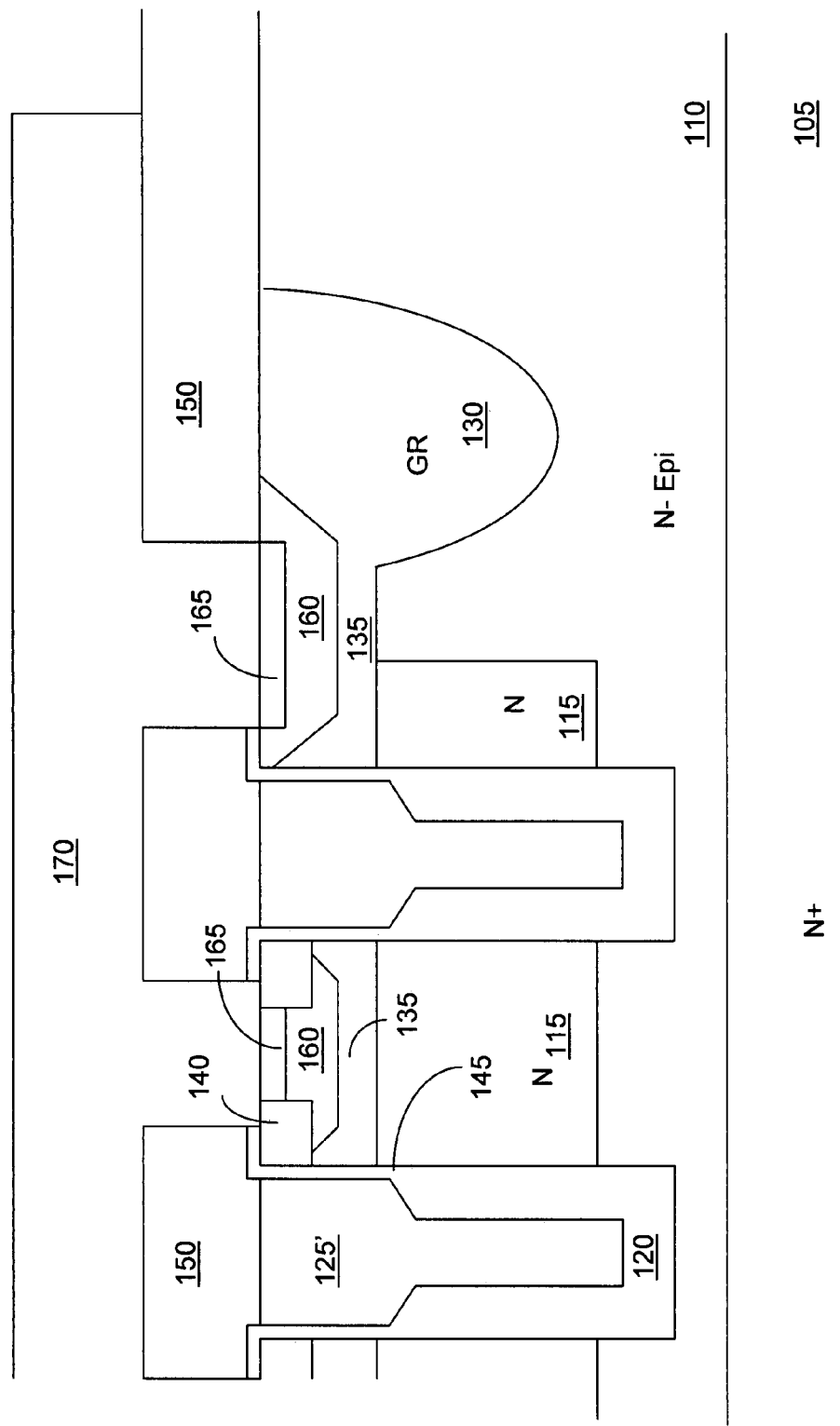

FIG. 5 shows a side cross sectional view of another alternate MOSFET device 100''', with similar device configuration as the MOSFET 100 of FIG. 3. The only difference is that the MOSFET 100''' is implemented with a gate 125'. Instead of the split gates included in the MOSFET 100 of FIG. 3, the gate 125' in the exemplary embodiment is a single segment gate. The gate 125' has a greater with at a top portion and a narrower width at a bottom portion. The bottom portion of the gate 125' is padded with a thick oxide layer 10 and the top portion of the gate 125' is padded with a thinner gate oxide 145'. By implementing the guard rings 135 similar to a configuration of a MOSFET device 100', the device 100''' satisfies a requirement that the breakdown voltage of the device is greater than fifty volts (50V) with requiring the guard rings in the termination area. The MOSFET device 100''' has the benefits of reduced Rds without degrading the breakdown voltages because of the tilt-angle implanted drift regions 115 next to the channel regions of the MOSFET device 100'''.

Figure 6:
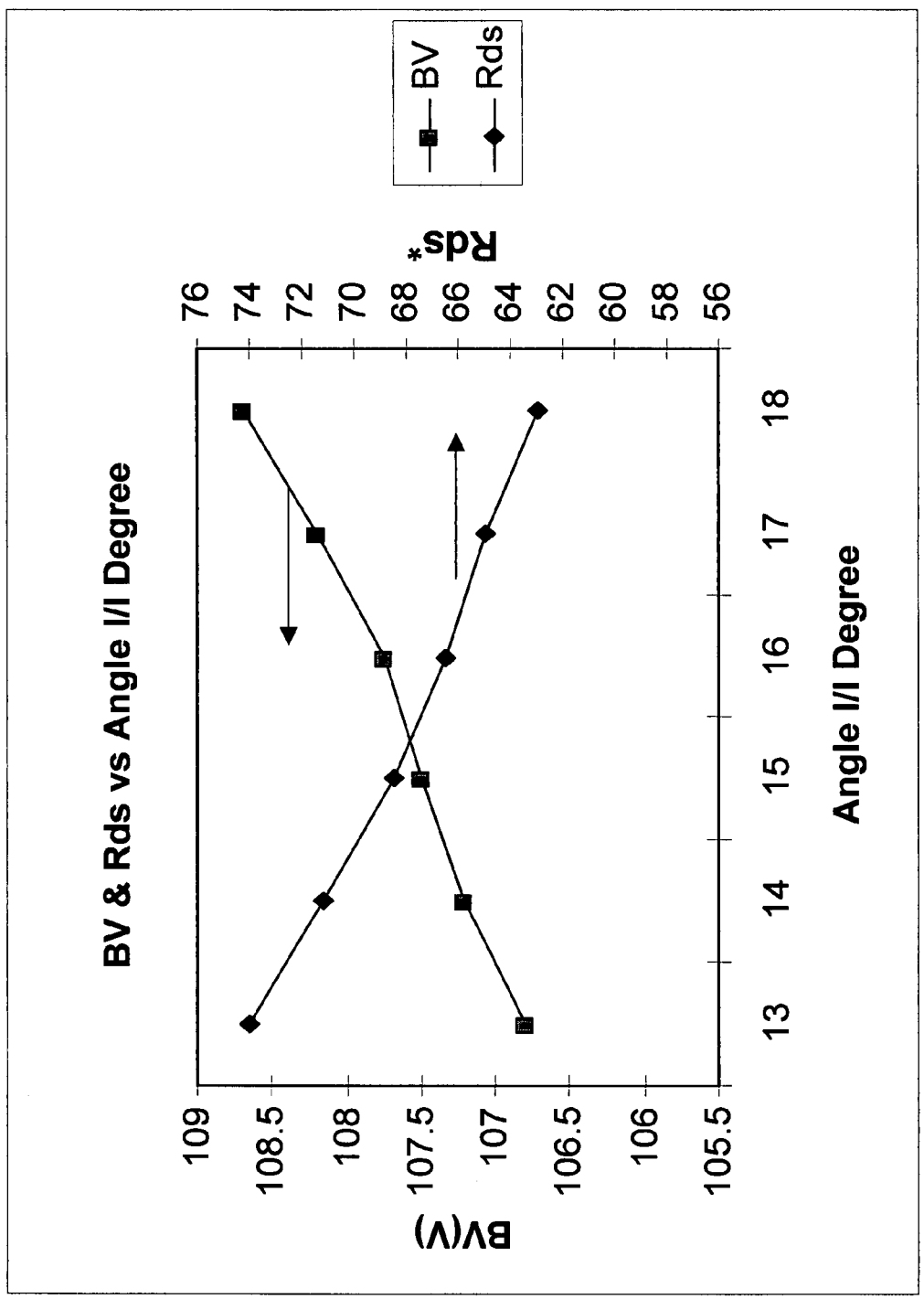
FIG. 6 is a diagram for showing the variations of the breakdown voltage and the Rds as a function of the tilt angle applied to form the tilt-angle implanted drift regions as shown in FIGS. 2 to 5.

FIG. 6 is a diagram for illustrating the variation of the breakdown voltage and the Rds versus the tilt angle applied to implant the tilt-angle implanted drift regions next to the trenched gate of the MOSFET devices. According to the simulation calculations shown in FIG. 6, the Rds is decreasing almost linearly with increased tilt angle used to implant the drift regions. In the meantime, the breakdown voltage is increased also with the increase of the tilt angle applied to implant the drift regions. The tilt angle of the drift region is approximately between 12 to 20 degrees according the results of the simulation calculation.

Figure 7A:
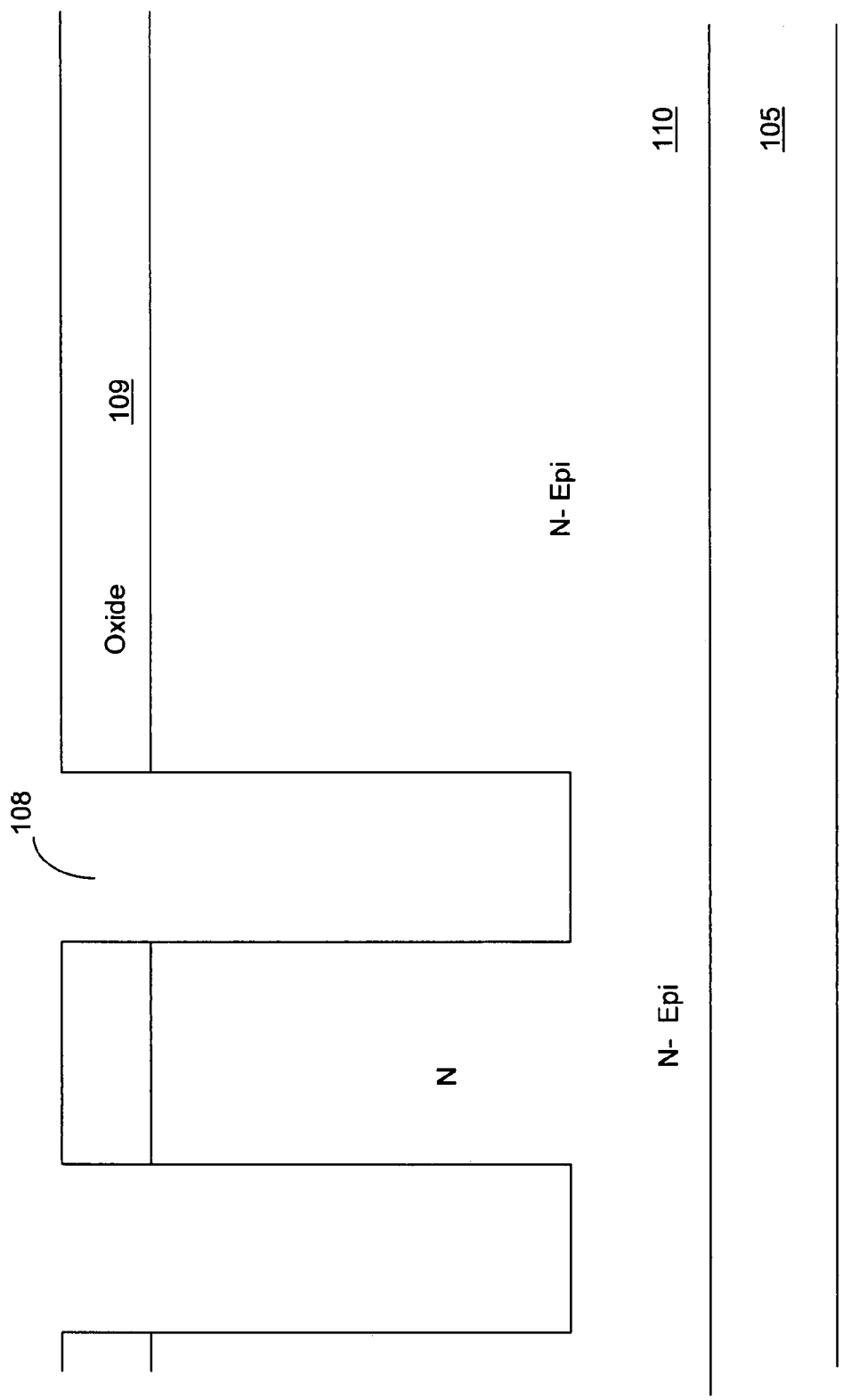
FIGS. 7A to 7H are a serial cross sectional views for describing the manufacturing processes to provide a trenched MOSFET device with of the present invention with tilt-angle implanted drift regions surrounding a lower portion of the trenched gates.
Figure 7B:
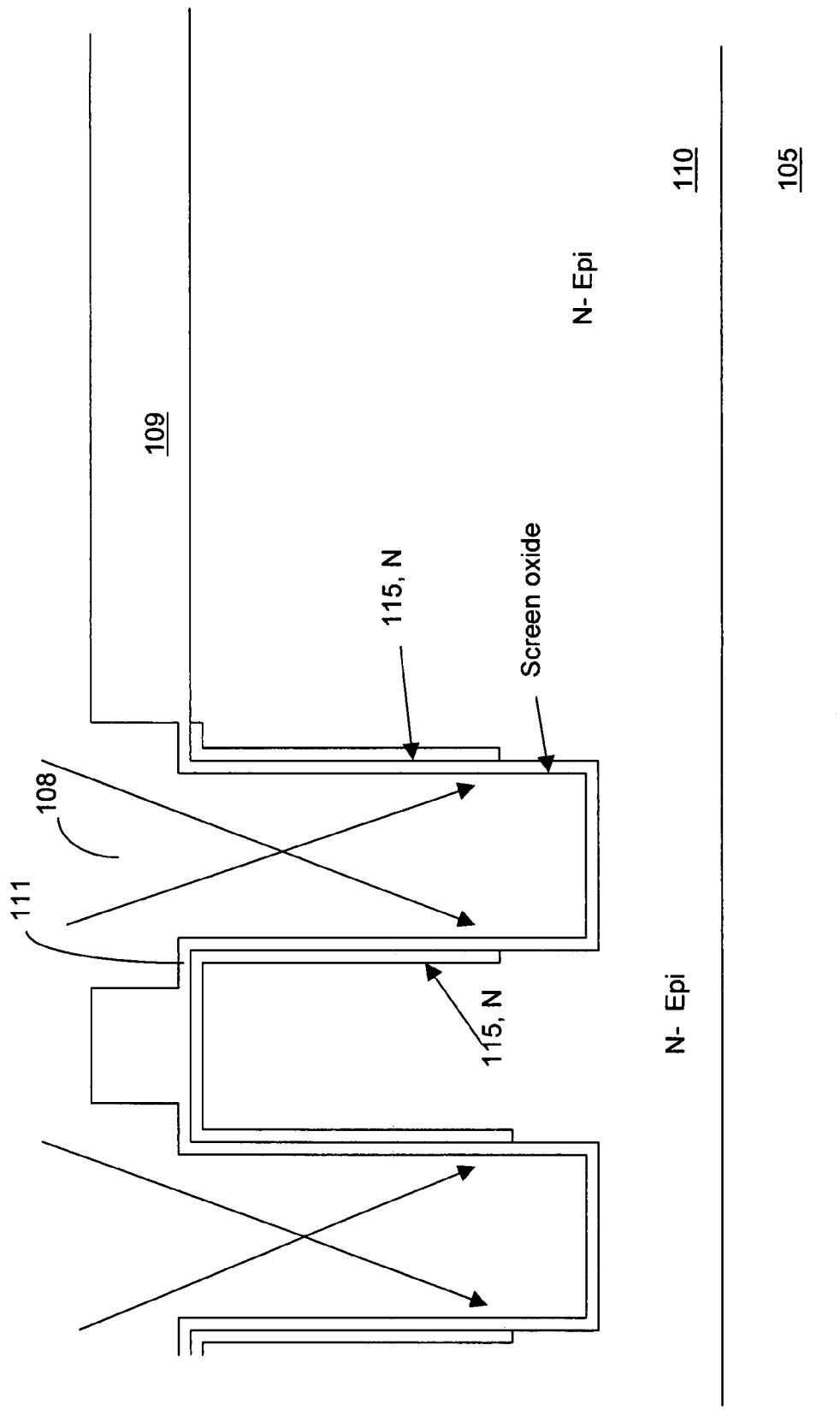
Figure 7C:
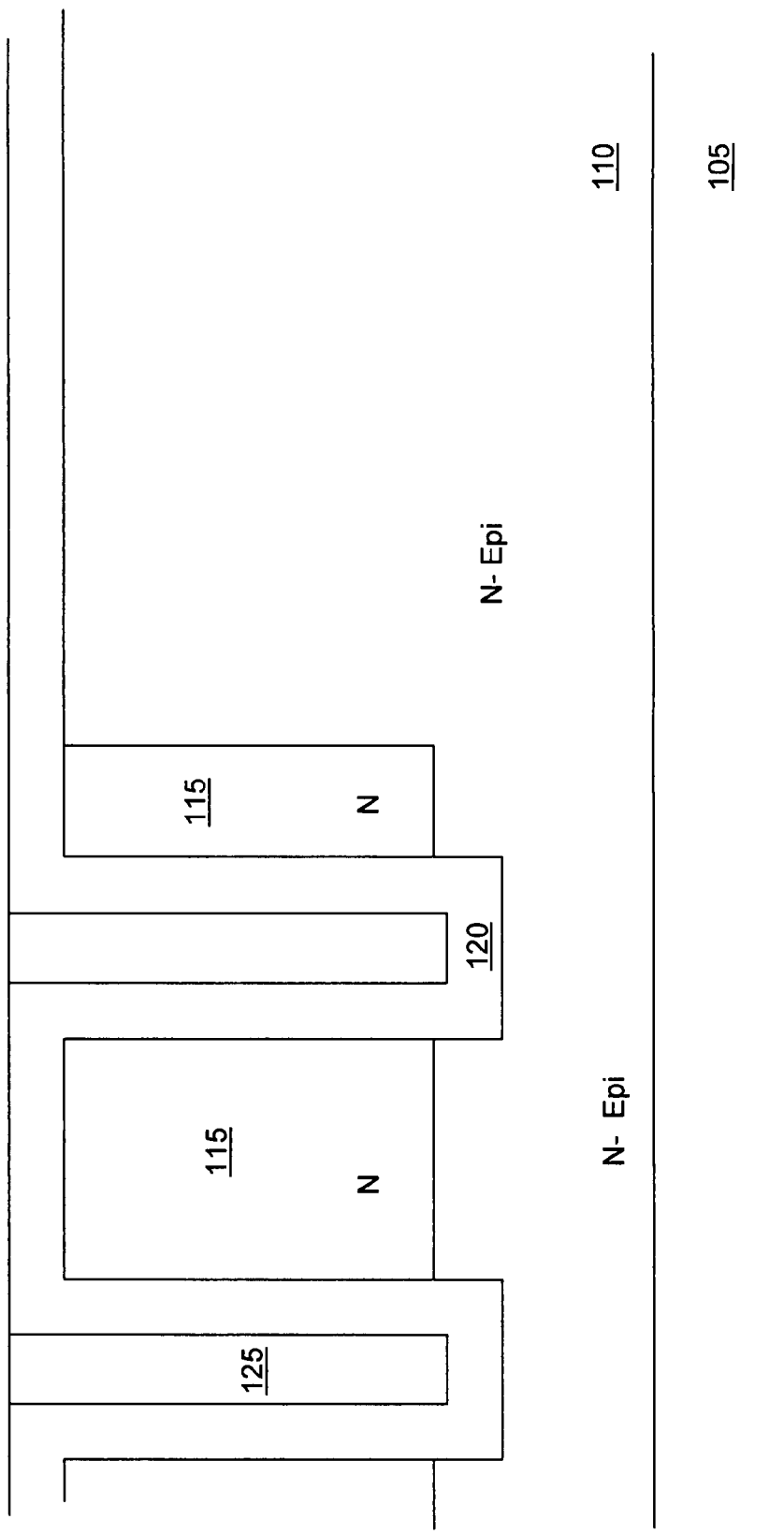
Figure 7D:
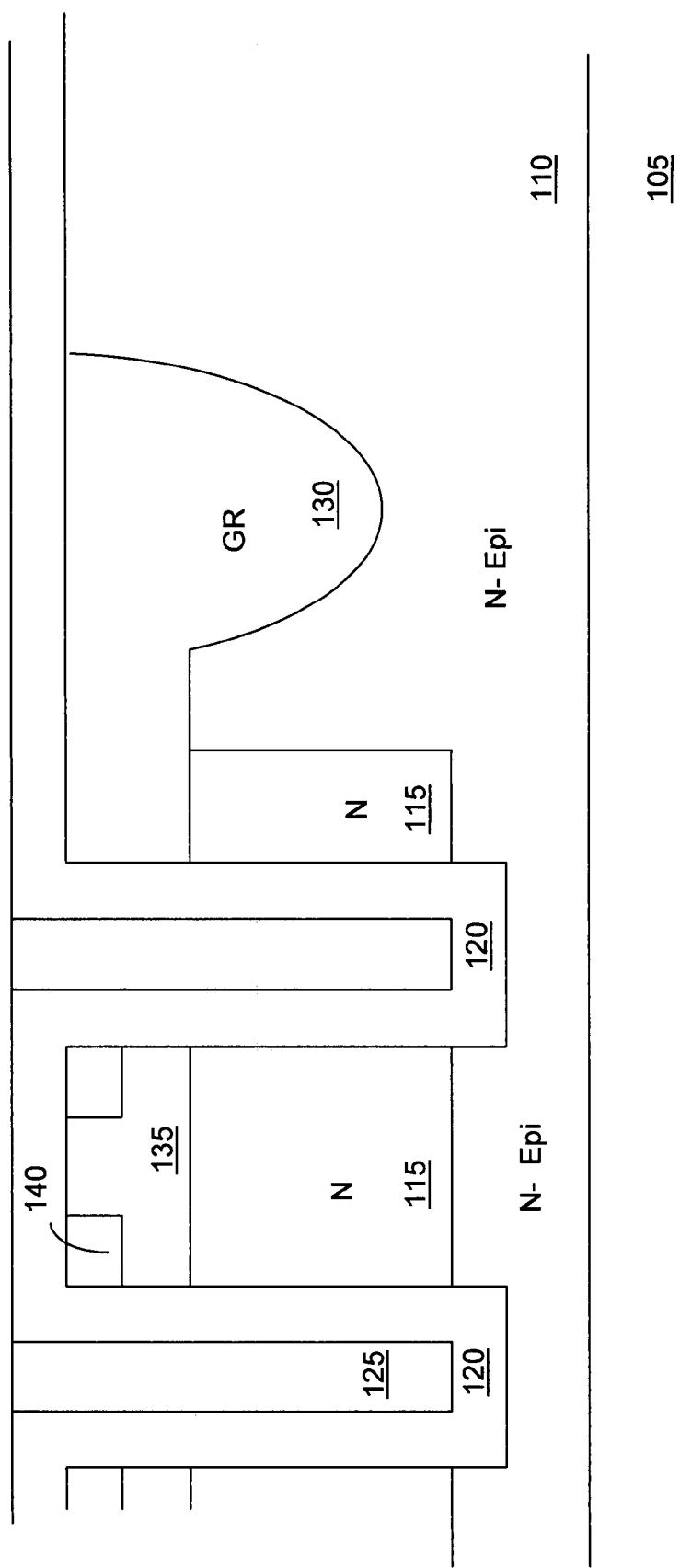

Referring to FIGS. 7A to 7H for a series of cross sectional views to illustrate the processing steps for manufacturing a MOSFET device as shown in FIGS. 2 and 3. In FIG. 7A, a trench mask (not shown) is applied to open a plurality of trenches 108 in an epitaxial layer 110 supported on a N+ substrate 105. Then an oxide layer 109 is grown that covers the top of the epitaxial layer 110 and the sidewalls and the bottom surface of the trenches 108. A dry oxide etch is carried out to remove the oxide layer from the sidewalls and the bottom surface of the trenches 108 followed by applying a silicon etch to open the trenches into a greater depth into the epitaxial layer 110. The thick oxide is formed to block the tilt-angle ion implantation from entering into top surface, especially in termination area. In FIG. 7B, a sacrificial oxide layer is grown (not shown) and removed to repair the sidewall surface of the trenches damaged by the trench etching process. A screen oxide layer 111 is grown for preventing an ion implantation damage. Then a phosphorous angular ion implant is carried out to form the N regions 115 around the sidewalls of the trenches 108. In FIG. 7C, a N-region diffusion is performed to diffuse the N-region 115 and the mask oxide layer 109 is removed followed by a thermal oxide growth the form a thick oxide layer 120. Then the trenches are filled with a doped polysilicon layer 120 followed by doped polysilicon etch back to remove the polysilicon layer from above the top of the trenches. In FIG. 7D, a guard ring mask (not shown) is applied to carry out a guard ring ion implant follow a diffusion process to develop a guard ring region 130 in the termination area. Then the guard ring mask is removed followed by applying a P-well mask (not shown) to perform a P-well ion implant and diffusion to form the P-body regions 135 in the N-region 115. Then the P-well mask is removed followed by applying a source mask (not shown). A source ion implant is carried out followed by a source diffusion process to develop the source regions 130 encompassed in the P-body regions 135.

Figure 7E:
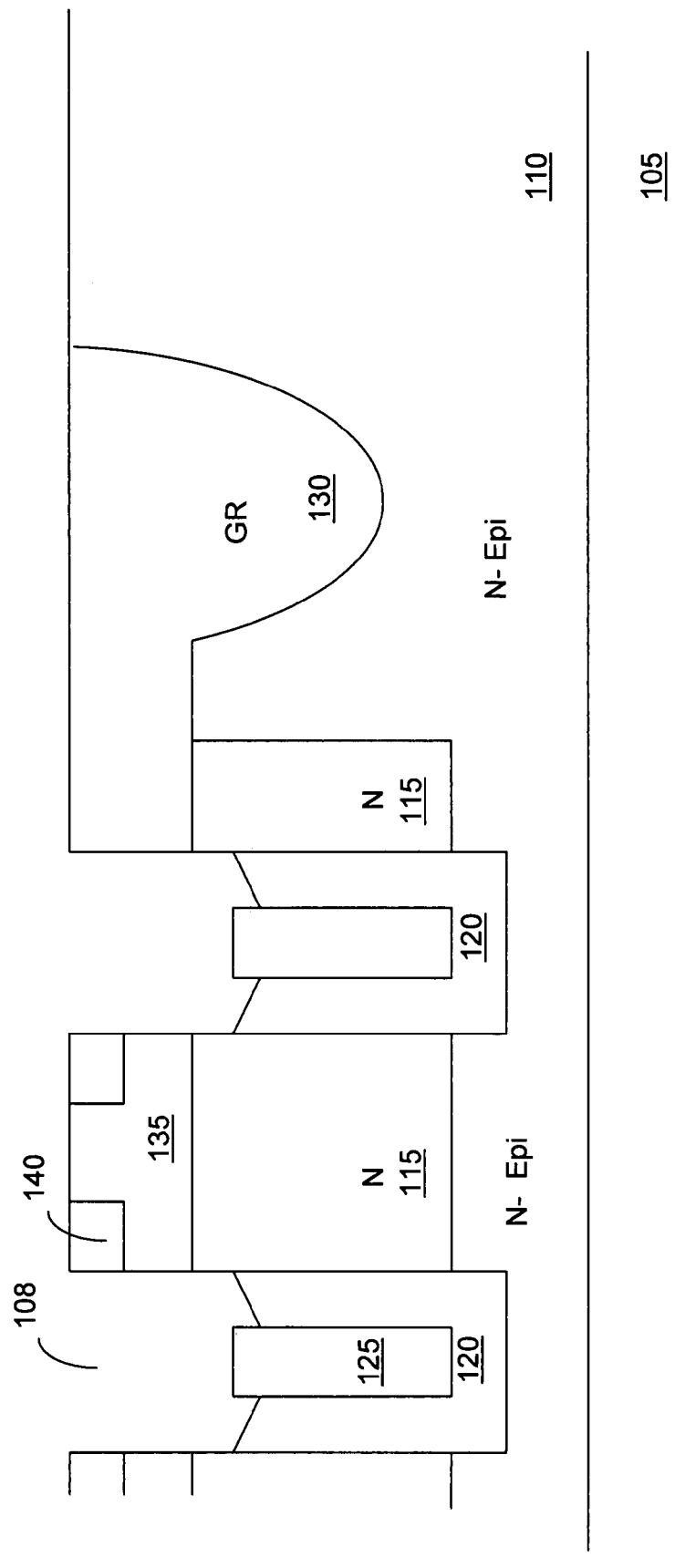
Figure 7F:
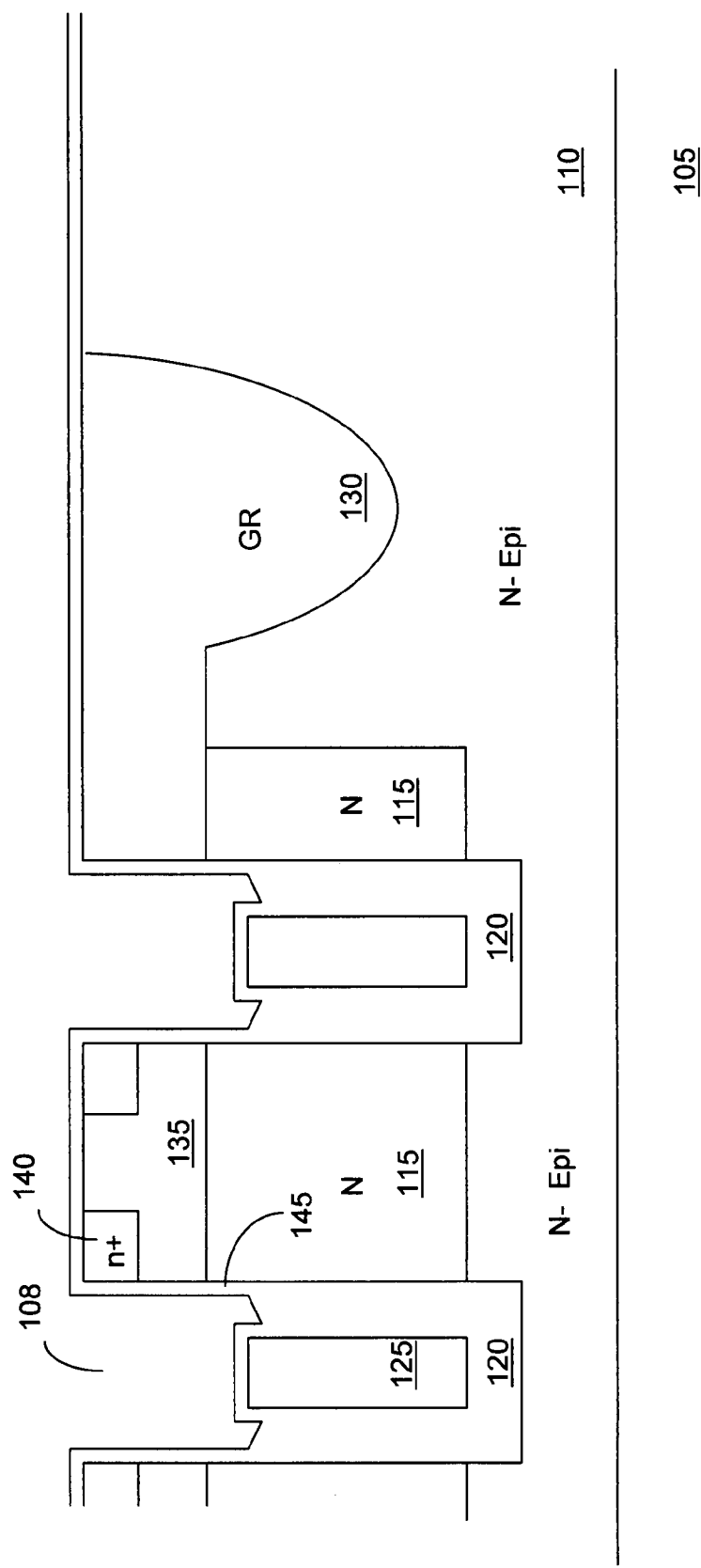
Figure 7G:
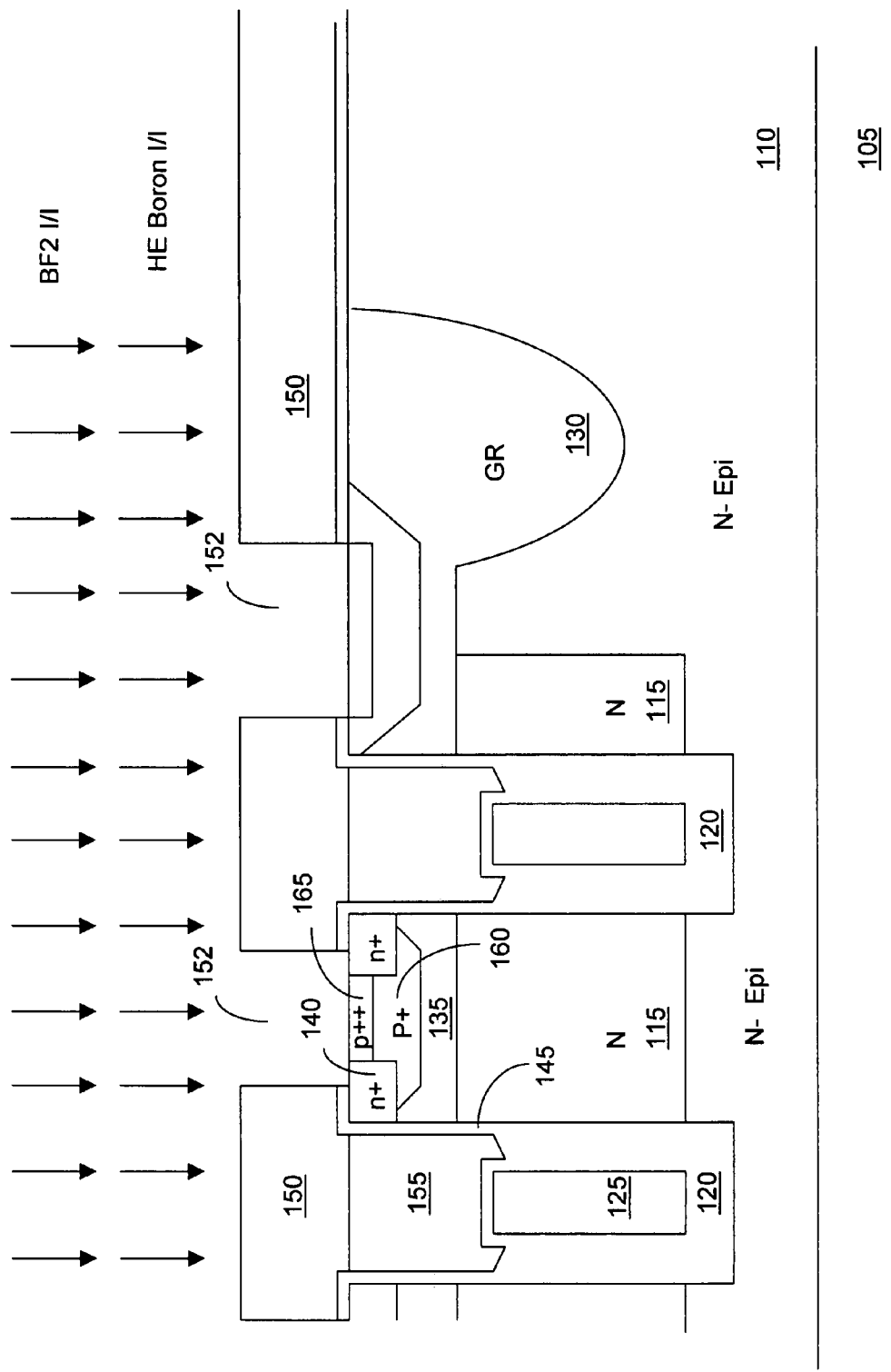
Figure 7H:
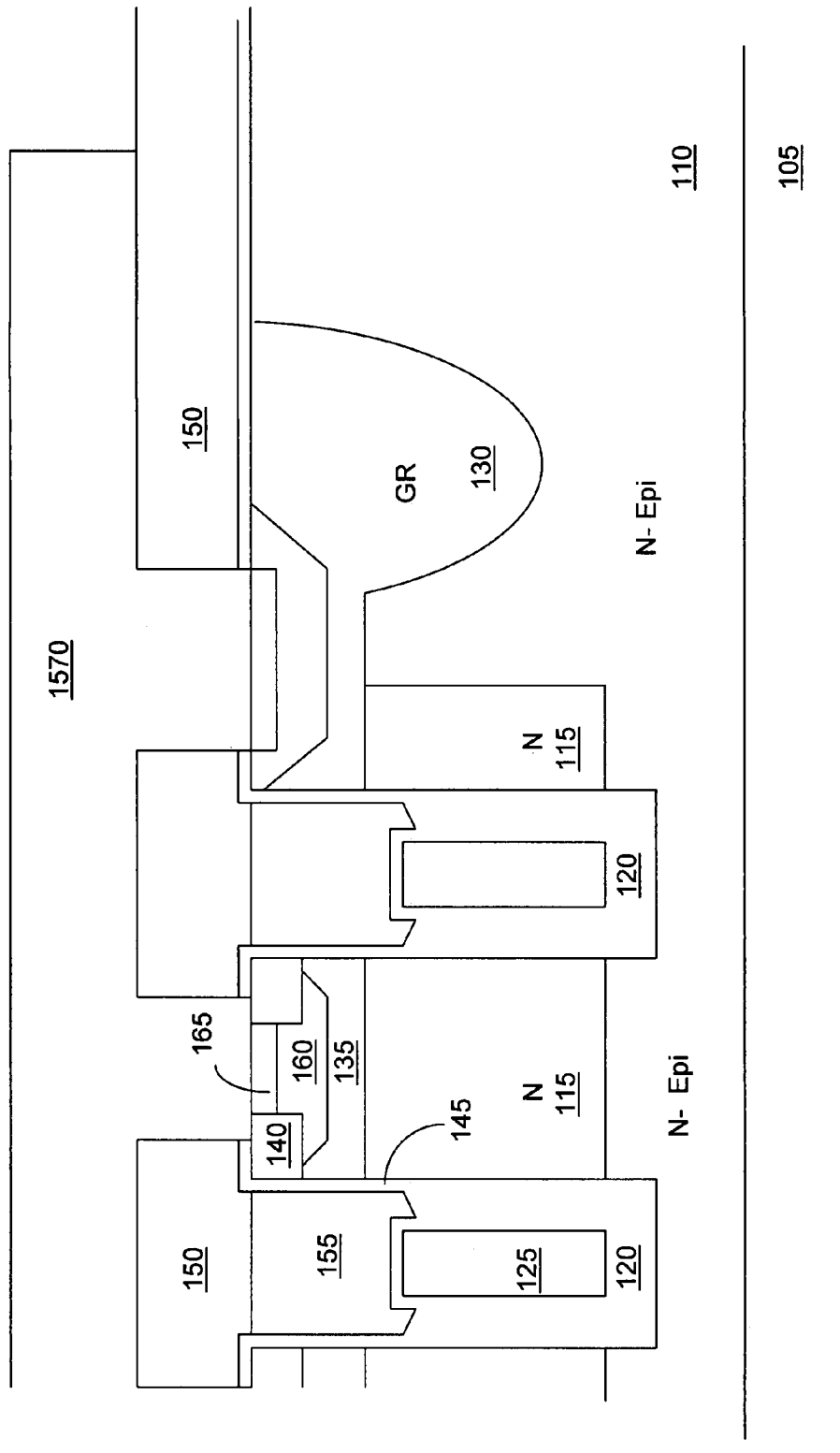

In FIG. 7E, a polysilicon etch is carried out followed by an oxide etch to remove the polysilicon 125 and the oxide layer 120 from the top portions of the trenches 108 while keeping the thick oxide layer 125 and the bottom segment of the polysilicon layer 125 inside the trenches 108. In FIG. 7F, a gate oxide layer 145 is grown to cover the top portions of the trench sidewalls and over the top surface of the epitaxial layer 110. In FIG. 7G, an oxide layer 150 is deposited over the top surface followed by applying a contact mask (not shown). A dry oxide etch is performed to open a plurality of contact openings 152 through the oxide layer 150. A high-energy boron ion implant is performed to form the P+ regions 160 in the P-body regions 135 below the source regions 140. Then a BF2 boron implant is carried out to form the P++ contact dopant regions 165 between the source regions 140. In FIG. 7H, a metal deposition is carried out to deposit a metal layer over the top surface then a metal mask (not shown) is applied to pattern the metal layer into source metal 170 and gate pad (not shown).

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A trenched semiconductor power device comprising a plurality of trenched gates surrounded by source regions near a top surface of a semiconductor substrate encompassed in body regions, said trenched semiconductor power device further comprising:
   tilt-angle implanted drift regions surrounding said trenched gate below said body regions for on-resistance reduction, and preventing a degraded breakdown voltage with a thick oxide in lower portion of trench sidewall and bottom; and
   said semiconductor power device further comprising a N-channel MOSFET device having N-type tilt-angle implanted drift regions in an N-epitaxial layer supported on a N+ substrate.

2. The trenched semiconductor power device of claim 1 further comprising:
   guard rings disposed at a termination area for operating at a breakdown voltage greater than fifty volts in a range substantially between fifty to two hundred volts.

3. The trenched semiconductor power device of claim 1 wherein:
   a field plate disposed at a termination area for operating at a breakdown voltage ranging between eight volts to fifty volts.

4. The trenched semiconductor power device of claim 1 wherein:
   each of said trenched gates having a thicker oxide layer on sidewalls of a lower portion of said trenched gates and a thinner oxide layer on sidewalls at an upper portion of said trenched gates.

5. The trenched semiconductor power device of claim 1 wherein:
   said N-epitaxial layer having a resistivity ranging between 0.3 to 3.0 mohm-cm and said trenched semiconductor power device having a breakdown voltage ranging between 8 to 200V volts.

6. A trenched semiconductor power device comprising a plurality of trenched gates surrounded by source regions near a top surface of a semiconductor substrate encompassed in body regions, said trenched semiconductor power device further comprising:
   tilt-angle implanted drift regions surrounding said trenched gate below said body regions for on-resistance reduction, and preventing a degraded breakdown voltage with a thick oxide in lower portion of trench sidewall and bottom; and
   said semiconductor power device further comprising a P-channel MOSFET device having P tilt-angle implanted drift regions in a P-epitaxial layer supported on a P+ type substrate.

7. The trenched semiconductor power device of claim 6 further comprising:
   guard rings disposed at a termination area for operating at a breakdown voltage greater than fifty volts in a range substantially between fifty to two hundred volts.

8. The trenched semiconductor power device of claim 6 further comprising:
   a field plate disposed at a termination area for operating at a breakdown voltage ranging between eight volts to fifty volts.

9. The trenched semiconductor power device of claim 6 wherein:
   each of said trenched gates having a thicker oxide layer on sidewalls of a lower portion of said trenched gates and a thinner oxide layer on sidewalls at an upper portion of said trenched gates.

10. The trenched semiconductor power device of claim 6 wherein:
    said P-epitaxial layer having a resistivity ranging between 0.3 to 3.0 mohm-cm and said trenched semiconductor power device having a breakdown voltage ranging between 8 to 200V volts.

11. A trenched semiconductor power device comprising a plurality of trenched gates surrounded by source regions near a top surface of a semiconductor substrate encompassed in body regions, said trenched semiconductor power device further comprising:
    tilt-angle implanted drift regions surrounding said trenched gate below said body regions for on-resistance reduction, and preventing a degraded breakdown voltage with a thick oxide in lower portion of trench sidewall and bottom; and
    each of said trenched gates further includes a bottom portion having a smaller width and padded with a thicker gate oxide layer on sidewalls of said trenched gates and a top portion having a greater width and padded with a thinner gate oxide layer on sidewalls of said trenched gates.

12. The trenched semiconductor power device of claim 11 wherein:

each of said bottom gate segments is padded by a thicker oxide layer on sidewalls of a lower portion of said trenched gates and each of said top gate segments is padded by a thinner oxide layer on sidewalls at an upper portion of said trenched gates.

13. A trenched semiconductor power device comprising a plurality of trenched gates surrounded by source regions near a top surface of a semiconductor substrate encompassed in body regions, said trenched semiconductor power device further comprising:

tilt-angle implanted drift regions surrounding said trenched gate below said body regions for on-resistance reduction, and preventing a degraded breakdown voltage with a thick oxide in lower portion of trench sidewall and bottom; and each of said trenched gates further includes a bottom gate segment and a top gate segment insulated by an inter-segment insulation layer wherein the bottom gate segment is connected to a source metal and the upper gate segment is connected to a gate pad.

* * * * *